(12) United States Patent
Hubaux et al.

(10) Patent No.: US 12,204,252 B2
(45) Date of Patent: *Jan. 21, 2025

(54) METHOD FOR DECISION MAKING IN A SEMICONDUCTOR MANUFACTURING PROCESS

(71) Applicant: ASML NETHERLANDS B.V., Veldhoven (NL)

(72) Inventors: Arnaud Hubaux, Erpent (BE); Johan Franciscus Maria Beckers, Veldhoven (NL); Dylan John David Davies, Heeswijk-Dinter (NL); Johan Gertrudis Cornelis Kunnen, Weert (NL); Willem Richard Pongers, Eindhoven (NL); Ajinkya Ravindra Daware, Eindhoven (NL); Chung-Hsun Li, Eindhoven (NL); Georgios Tsirogiannis, Eindhoven (NL); Hendrik Cornelis Anton Borger, Eindhoven (NL); Frederik Eduard De Jong, Veldhoven (NL); Juan Manuel Gonzalez Huesca, Eindhoven (NL); Andriy Hlod, Eindhoven (NL); Maxim Pisarenco, Son en Breugel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 15 days.

This patent is subject to a terminal disclaimer.

(21) Appl. No.: 18/212,334

(22) Filed: Jun. 21, 2023

(65) Prior Publication Data

US 2023/0333482 A1 Oct. 19, 2023

Related U.S. Application Data

(63) Continuation of application No. 17/423,325, filed as application No. PCT/EP2020/050354 on Jan. 9, 2020, now Pat. No. 11,687,007.

(30) Foreign Application Priority Data

Jan. 29, 2019 (EP) .................................... 19154100
Feb. 6, 2019 (EP) .................................... 19155660
Nov. 18, 2019 (EP) .................................... 19209695

(51) Int. Cl.
*G03F 1/70* (2012.01)
*G03F 7/00* (2006.01)
*G06F 30/392* (2020.01)

(52) U.S. Cl.
CPC ............ *G03F 7/70508* (2013.01); *G03F 1/70* (2013.01); *G03F 7/70616* (2013.01);
(Continued)

(58) Field of Classification Search
CPC .... G03F 7/70508; G03F 1/70; G03F 7/70616; G03F 7/70491; G06F 30/392;
(Continued)

(56) References Cited

U.S. PATENT DOCUMENTS 5,229,872 A 7/1993 Mumola
5,296,891 A 3/1994 Vogt et al.
(Continued)

FOREIGN PATENT DOCUMENTS

CN 104008550 8/2014
CN 104681474 6/2015
(Continued)

OTHER PUBLICATIONS

Notification of Grant issued in corresponding Chinese Patent Application No. 202080011275.9, dated Jan. 23, 2024.
(Continued)

*Primary Examiner* — Nghia M Doan
(74) *Attorney, Agent, or Firm* — Pillsbury Winthrop Shaw Pittman, LLP

(57) ABSTRACT

A method for categorizing a substrate subject to a semiconductor manufacturing process including multiple operations,
(Continued)

the method including: obtaining values of functional indicators derived from data generated during one or more of the multiple operations on the substrate, the functional indicators characterizing at least one operation; applying a decision model including one or more threshold values to the values of the functional indicators to obtain one or more categorical indicators; and assigning a category to the substrate based on the one or more categorical indicators.

20 Claims, 6 Drawing Sheets

(52) U.S. Cl.
CPC ............... *G06F 30/392* (2020.01); *G05B 2219/45028* (2013.01); *G05B 2219/45031* (2013.01)

(58) Field of Classification Search
CPC ........... G05B 2219/45028; G05B 2219/45031; G05B 2219/49013; Y02P 90/02; Y02P 90/80
See application file for complete search history.

(56) References Cited

U.S. PATENT DOCUMENTS

| | | | |
|---|---|---|---|
| 5,523,193 A | 6/1996 | Nelson | |
| 5,845,105 A | 12/1998 | Kunikiyo et al. | |
| 6,248,602 B1 | 6/2001 | Bode et al. | |
| 6,405,096 B1 | 6/2002 | Toprac et al. | |
| 6,952,253 B2 | 10/2005 | Lof et al. | |
| 9,910,481 B2* | 3/2018 | Lee | G06F 1/324 |
| 10,627,723 B2 | 4/2020 | Middlebrooks et al. | |
| 10,755,025 B2 | 8/2020 | Chen et al. | |
| 11,119,414 B2 | 9/2021 | Middlebrooks et al. | |
| 11,687,007 B2* | 6/2023 | Hubaux | G03F 1/70 716/55 |
| 2003/0088847 A1 | 5/2003 | Chang et al. | |
| 2006/0009872 A1* | 1/2006 | Prager | G01B 11/24 700/121 |
| 2006/0016561 A1 | 1/2006 | Choi et al. | |
| 2007/0048635 A1 | 3/2007 | Schulze et al. | |
| 2007/0085991 A1 | 4/2007 | Liegl et al. | |
| 2010/0030360 A1 | 2/2010 | Habets et al. | |
| 2010/0214550 A1 | 8/2010 | Hulsebos et al. | |
| 2011/0007961 A1 | 1/2011 | Iwanaga | |
| 2012/0008127 A1 | 1/2012 | Tel et al. | |
| 2013/0204418 A1 | 8/2013 | Chang | |
| 2013/0268469 A1 | 10/2013 | Sharma et al. | |
| 2013/0338808 A1 | 12/2013 | Baseman et al. | |
| 2014/0223406 A1 | 8/2014 | Teller et al. | |
| 2015/0371134 A1 | 12/2015 | Chien et al. | |
| 2016/0148850 A1 | 5/2016 | David | |
| 2016/0299438 A1* | 10/2016 | Mos | G06F 3/0482 |
| 2016/0313651 A1 | 10/2016 | Middlebrooks et al. | |
| 2018/0150038 A1 | 5/2018 | Lin et al. | |
| 2019/0121237 A1 | 4/2019 | Nurani et al. | |
| 2020/0026196 A1 | 1/2020 | Luo et al. | |
| 2020/0050099 A1 | 2/2020 | Su et al. | |

FOREIGN PATENT DOCUMENTS

| | | |
|---|---|---|
| CN | 107077077 | 8/2017 |
| KR | 10-2017-0061628 | 6/2017 |
| KR | 10-2017-0066524 | 6/2017 |
| TW | 201530333 | 8/2015 |
| TW | 201837759 | 10/2018 |
| TW | 201901285 | 1/2019 |
| WO | 99/49504 | 9/1999 |
| WO | 2011081645 | 7/2011 |
| WO | 2015101458 | 7/2015 |
| WO | 2018133999 | 7/2018 |
| WO | 2018202361 | 11/2018 |

OTHER PUBLICATIONS

International Search Report and Written Opinion issued in corresponding PCT Patent Application No. PCT/EP2020/050354, dated Apr. 29, 2021.

Taiwanese Office Action issued in corresponding Taiwanese Patent Application No. 109101637, dated Oct. 19, 2020.

Notification of Reasons for Refusal dated Apr. 7, 2023, issued in corresponding Korean Patent Application No. 10-2021-7023941 with English translation (14 pgs.).

Office Action issued in corresponding Taiwanese Patent Application No. 110111850, dated Jul. 24, 2023.

* cited by examiner

METHOD FOR DECISION MAKING IN A SEMICONDUCTOR MANUFACTURING PROCESS

This application is a continuation of pending U.S. patent application Ser. No. 17/423,325, filed Jul. 15, 2021, which is a U.S. national phase entry of PCT Patent Application No. PCT/EP2020/050354 which was filed on Jan. 9, 2020, which claims the benefit of priority of European Patent Application No. 19154100.2 which was filed on Jan. 29, 2019, of European Patent Application No. 19155660.4 which was filed on Feb. 6, 2019, and of European Patent Application No. 19209695.6 which was filed on Nov. 18, 2019, each of the foregoing applications is incorporated herein in its entirety by reference.

FIELD

The present description relates to a semiconductor manufacturing process, in particular methods to categorize substrates being subject to the semiconductor manufacturing process, for example to enable making a decision, such as whether a substrate should be reworked, inspected or proceed to a further process step of the semiconductor manufacturing process.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

These tight control loops are generally based on metrology data obtained using a metrology tool measuring characteristics of the applied pattern or of metrology targets representing the applied pattern. In general the metrology tool is based on optical measurement of the position and/or dimensions of the pattern and/or targets. It is intrinsically assumed that these optical measurements are representative for a quality of the process of manufacturing of the integrated circuits.

In addition to control based on optical measurements, also e-beam based measurements may be performed; among which a so-called low voltage measurement using an e-beam tool (as offered by HMI) may be utilized. Such a low voltage contrast measurement is indicative of the quality of electrical contact between layers applied to the substrate.

To avoid loss of yield (complete loss and scrapping of a substrate), it is sometimes necessary to rework a substrate. Reworking essentially comprises the undoing of a previous exposure step, e.g., by stripping away all of an exposed layer, and re-exposing that layer. This may be necessary if it is determined that the exposed structures are out of specification in some way; for example if the overlay is too great, or CD is too small or insufficiently uniform, such that the device is likely to be non-functional. However, rework, and even checking a substrate to see if it requires reworking, incurs a significant throughput penalty. As such, an improved method for making decisions such as these (and others) is desired.

SUMMARY

It is an object to, for example, address the mentioned disadvantages of the state of the art.

In a first aspect, there is provided a method for categorizing a substrate subject to a semiconductor manufacturing process comprising multiple operations, the method comprising: obtaining values of functional indicators derived from data generated during one or more of the multiple operations on the substrate, the functional indicators characterizing at least one operation; applying a decision model comprising one or more threshold values to the values of the functional indicators to obtain one or more categorical indicators; and assigning a category to the substrate based on the one or more categorical indicators.

In a second aspect, there is provided a method for constructing a decision model for making a decision within a semiconductor manufacturing process, the method comprising: obtaining data relating to one or more parameters of a patterning step of the semiconductor manufacturing process; deriving one or more categorical indicators from the data, each of the one or more categorical indicators being indicative of a quality of the semiconductor manufacturing process based on at least one threshold value; and training the decision model on measurements performed on substrates having undergone the patterning step and corresponding decisions and/or categories assigned thereto, the training setting a value for each of the one or more threshold values, such that the decision model outputs an appropriate value for each of the one or more categorical indicators based on the data.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. More information on such mirror arrays is given in U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

Figure 1:
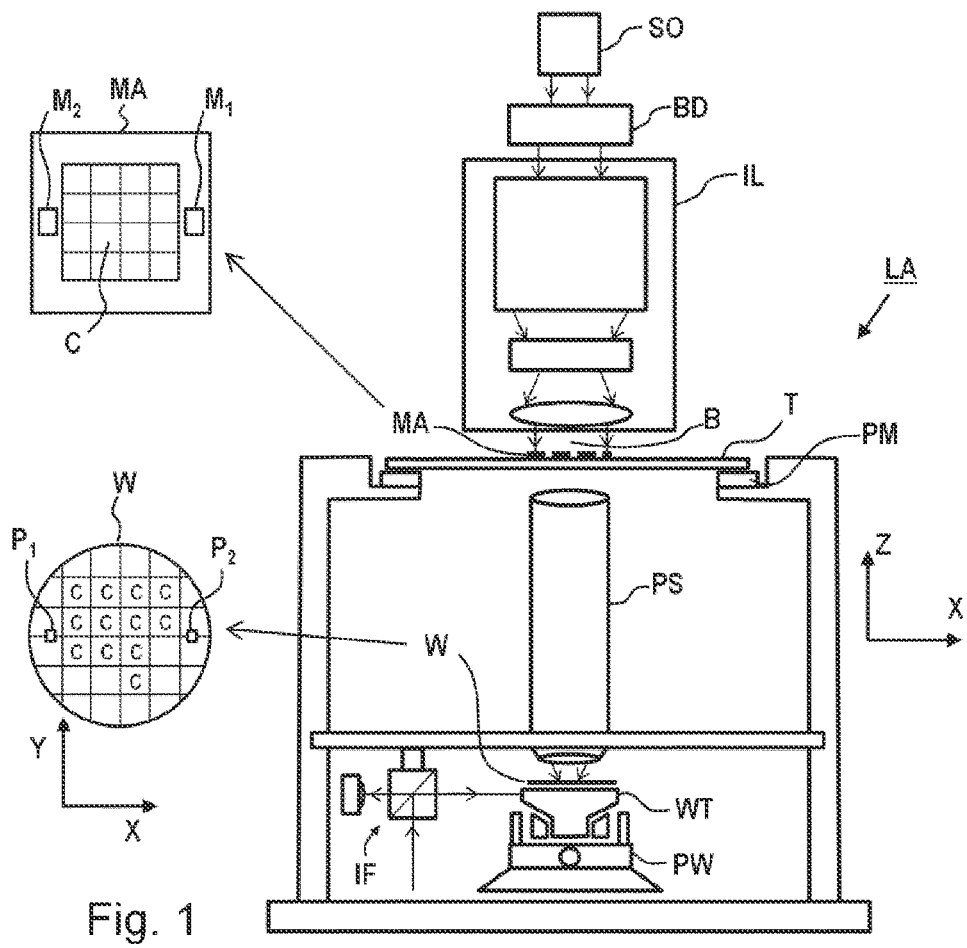
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support structure (e.g., a mask table) MT constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT publication No. WO99-49504, which are incorporated herein by reference.

The lithographic apparatus LA may also be of a type having two (dual stage) or more substrate tables WT and, for example, two or more support structure MT (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table MT), and is patterned by the patterning device MA. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the mask MA with respect to the path of the radiation beam B. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Figure 2:
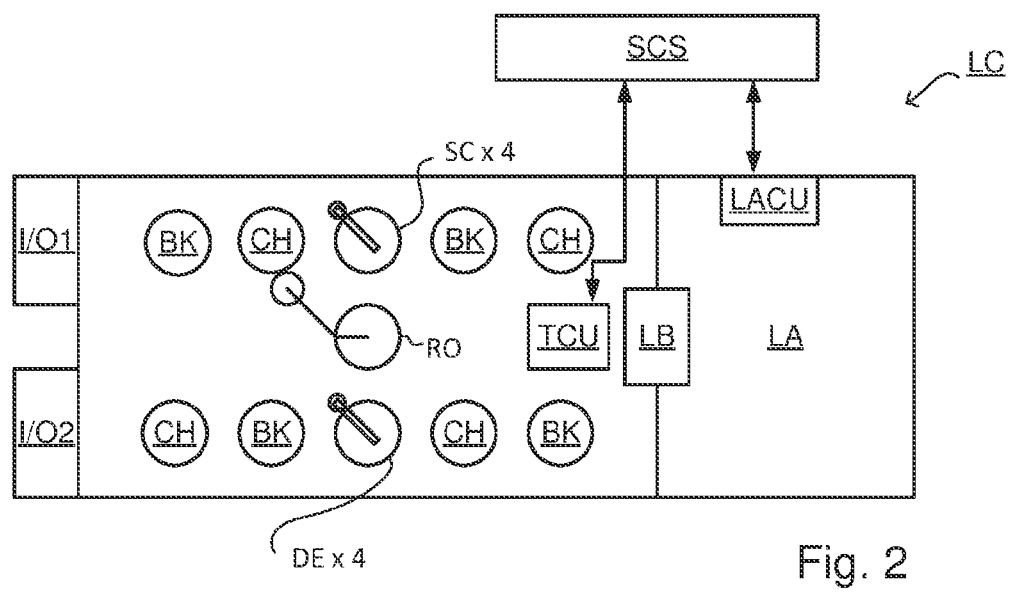
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
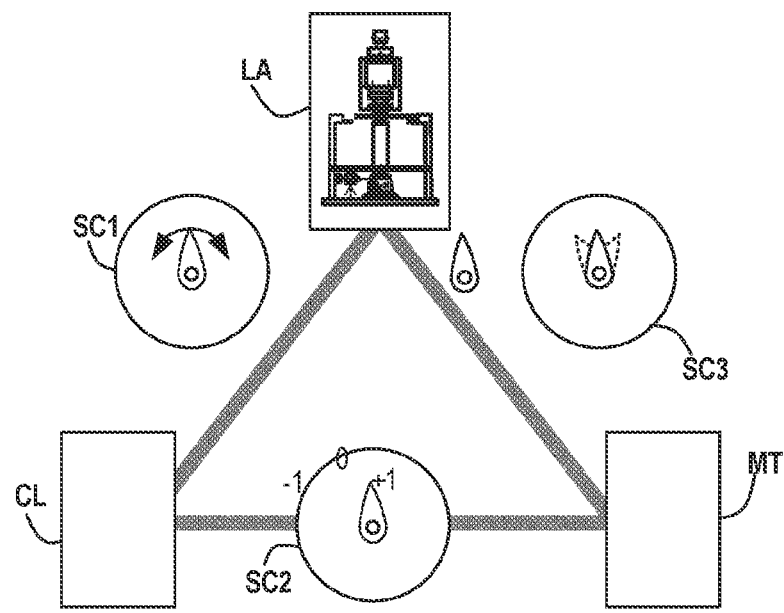
FIG. 3 depicts a schematic representation of holistic lithography, representing cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double white arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT), so as to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

The lithographic apparatus LA is configured to accurately reproduce the pattern onto the substrate. The positions and dimensions of the applied features need to be within certain tolerances. Position errors may occur due to an overlay error (often referred to as "overlay"). The overlay is the error in placing a first feature during a first exposure relative to a second feature during a second exposure. The lithographic apparatus minimizes the overlay errors by aligning each wafer accurately to a reference prior to patterning. This is done by measuring positions of alignment marks on the substrate using an alignment sensor. More information on the alignment procedure can be found in U.S. Patent Application Publication No. US20100214550, which is incorporated herein by reference. Pattern dimensioning (e.g., CD) errors may, for example, occur when the substrate is not positioned correctly with respect to a focal plane of the lithographic apparatus. These focal position errors may be associated with un-flatness of a substrate surface. The lithographic apparatus minimizes these focal position errors by measuring the substrate surface topography prior to patterning using a level sensor. Substrate height corrections are applied during subsequent patterning to assure correct imaging (focusing) of the patterning device onto the substrate. More information on the level sensor system can be found in U.S. Patent Application Publication No. US20070085991, which is incorporated herein by reference.

Besides the lithographic apparatus LA and the metrology apparatus MT other processing apparatus may be used during IC production as well. An etching station (not shown) processes the substrates after exposure of the pattern into the resist. The etch station transfers the pattern from the resist into one or more layers underlying the resist layer. Typically etching is based on application of a plasma medium. Local etching characteristics may, for example, be controlled using temperature control of the substrate or directing the plasma medium using a voltage controlled ring. More information on etching control can be found in international Patent Application Publication No. WO2011081645 and U.S. Patent Application Publication No. US 20060016561 which are incorporated herein by reference.

During the manufacturing of the ICs, it is of great importance that the process conditions for processing substrates using processing apparatus, such as the lithographic apparatus or etching station, remain stable such that properties of the features remain within certain control limits. Stability of the process is of particular importance for features of the functional parts of the IC, i.e., the product features. To guarantee stable processing, process control capabilities need to be in place. Process control involves monitoring of processing data and implementation of means for process correction, e.g. control the processing apparatus based on characteristics of the processing data. Process control may be based on periodic measurement by the metrology apparatus MT, often referred to as "Advanced Process Control" (further also referenced to as APC). More information on APC can be found in U.S. Patent Application Publication No. US20120008127, which is incorporated herein by reference. A typical APC implementation involves periodic measurements on metrology features on the substrates to monitor and correct drifts associated with one or more processing apparatus. The metrology features reflect the response to process variations of the product features. The sensitivity of the metrology features to process variations may be different compared to the sensitivity of the product features. In that case, a so-called "Metrology To Device" offset (further also referenced to as MTD) may be determined. To mimic the behavior of product features, the metrology targets may incorporate segmented features, assist features or features with a particular geometry and/or dimension. A carefully designed metrology target should respond in a similar fashion to process variations as the product features. More information on metrology target design can be found in international Patent Application Publication No. WO 2015101458 which is incorporated herein by reference.

The term fingerprint may refer to a main (systematic) contributor ("latent factor") of a measured signal, and in particular a contributor connected to the performance impact on-wafer or to previous processing steps. Such a fingerprint can refer to substrate (grid) patterns (e.g. from alignment, leveling, overlay, focus, CD), field patterns (e.g., from intrafield alignment, leveling, overlay, focus, CD), substrate zone patterns (e.g., outermost radius of wafer measurements) or even patterns in scanner measurements related to wafer exposure (e.g., heating signature through-lot from reticle alignment measurements, temperature/pressure/servo profiles, etc.). Fingerprints may be comprised within a fingerprint collection, and may be encoded homogenously or heterogeneously therein.

Electrical measurement data is typically obtained after processing of substrates. Typically, when performing electrical metrology to obtain the electrical measurement data, all the dies on the substrates are measured using probes which make (near) contact to the circuits formed during the processing. Various types of measurements may be performed; voltage, current, resistance, capacitance and inductance measurements, for example. These measurements may be performed under different conditions (frequencies, voltage, current for example) and at a plurality of locations across the die. The electrical measurement may comprise an evaluation of whether a particular structure/feature or device is functional (e.g., within specification). Alternatively, or in addition, the electrical measurement may be categorized according to "bin codes". An electrical measurement associated with a certain measured parameter (current, voltage, resistance, capacitance, inductance) at a certain condition is commonly referred to as a separate "bin code". Hence a typical electrical measurement across a die may be represented by a plurality of graphs, each graph representing a spatial distribution of values associated with a particular bin code. Throughout the text, "bin code" and "electrical characteristic" is used synonymously such that a value of a bin code associated with the substrate is referred to as a value of an electrical characteristic of the substrate. Electrical measurement data may also comprise bit asymmetry data or any other yield parameter.

The properties (minimum value, maximum value, variance or any other statistical measure) of the measured electrical characteristics are important indicators regarding the probability that a certain circuit on a die will be functional. Hence a strong relationship exists between the electrical characteristic and the yield of the process. Hence for yield control, electrical characteristic measurements are indispensable. However, they are also time consuming and are only performed at the end stage of the semiconductor manufacturing process (e.g. when options for correcting non-functional circuits are virtually absent).

Deciding which substrates should be inspected and/or reworked after exposure is an important consideration which will have an impact on throughput and yield. Errors in classification will result in yield wastage, as undetected out-of-speciation/non-functioning devices will be processed, or else too many false alarms, resulting in unnecessary checks and low efficiency.

Presently, statistical control techniques are applied on scanner data to set control limits for deciding which substrates should be inspected or reworked after exposure. However, the amount of data available for such analyses is extremely large. Without deep scanner knowledge, process knowledge and brute force data analytics techniques are required to identify the correct parameters, resulting in sub-optimal usage of the data. Statistical control techniques are blind to the physics of the Scanner. They mostly infer correlations from data, not causations. This makes it virtually impossible to understand the behavior of the Scanner and adapt it to prevent future issues. Whether manually, or supported by statistical binning, maintaining control limits per layer per indicator (e.g., key performance indicator or KPI) is extremely time-consuming and error-prone.

Additionally, there are two parties (the scanner manufacturer and the scanner user), neither of which necessarily has access to all the information required for efficient decision making. The scanner manufacturer will have knowledge of scanner sensitivities to features exposed on a particular layer, which are critical in properly defining reliable issue predictors. Such information is sensitive and typically is not shared with the user. Similarly, user sensitive information regarding manufacture of devices (e.g., ICs) using the scanner, such as reticle information, illumination mode, facet mirror rendering, is typically not shared with the manufacturer.

A fault detection and classification (FDC) is proposed which is physics driven, rather than statistics driven, and which does not require the sharing of sensitive data between scanner manufacturer and user. The proposal comprises identifying and isolating the relevant scanner parameters which have a known on-product impact. The parameters may comprise those which can be measured after each exposure (e.g. lens Zernike's) or during dedicated service steps (e.g. EUV collector far field image reconstruction for conventional pupil). New indicators are defined which aggregate scanner data into models that reflect the relevant physics of the scanner systems. Models which link these indicators to categorical on-product indicators are then defined. These models are used to make decisions during the manufacture process, for example, to decide whether a substrate should be checked and/or reworked. The decision making can be checked against the actual decision/categorization made, such as whether a rework was required or otherwise (i.e., the result of the checking is fed back, but not any sensitive metrology data) so as to validate and improve the decision making. In this way, the decision making can be tuned to a particular process without the sharing of user sensitive information.

As such, the proposed method comprises making a decision as part of a manufacturing process, the method comprising: obtaining scanner data relating to one or more parameters of a lithographic exposure step of the manufacturing process; deriving a categorical indicator from the scanner data, the categorical indicator being indicative of a quality of the manufacturing process; and deciding on an action based on the categorical indicator. Scanner data relating to one or more parameters of a lithographic exposure step may comprise data produced by the scanner itself, either during or in preparation of the exposure step, and/or generated by another station (e.g., a stand-alone measuring/alignment station) in a preparatory step for the exposure. As such, it does not necessarily have to be generated by or within the scanner. The term scanner is used generally to describe any lithographic exposure apparatus.

Figure 4:
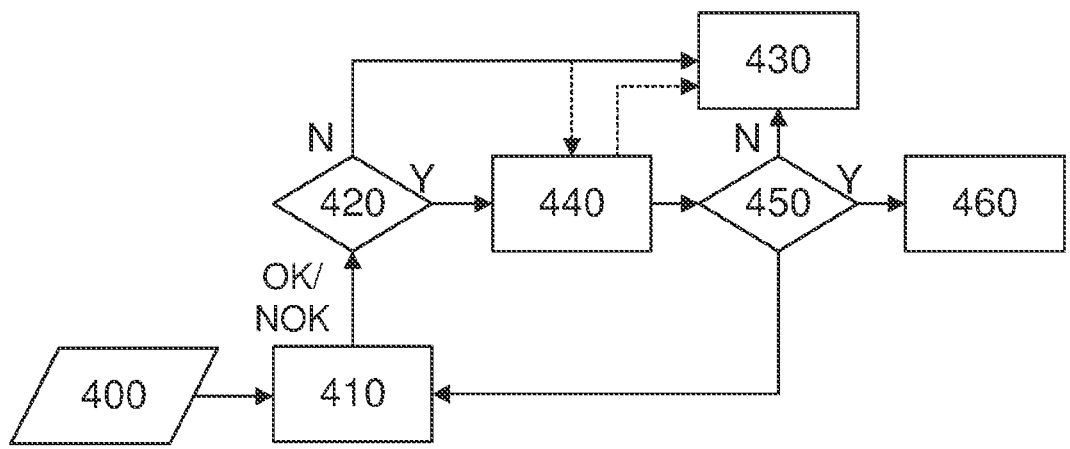
FIG. 4 is a flowchart of a decision-making method according to a first embodiment of the invention.

FIG. 4 is a flowchart describing a method for making a decision in a manufacturing process utilizing a fault detection and classification (FDC) method/system as disclosed herein. Scanner data 400 is generated during exposure (i.e., exposure scanner data), or following a maintenance action (or by any other means). This scanner data 400, which is numerical in nature, is fed into the FDC system 410. The FDC system 410 converts the data into functional, scanner physics-based indicators and aggregates these functional indicators according to the system physics, so as to determine a categorical system indicator for each substrate. The categorical indicator could be binary, such as whether they meet a quality threshold (OK) or not (NOK). Alternatively there may be more than two categories (e.g., based on statistical binning techniques). Typically functional indicators are associated with a separate module comprised within the scanner, the module associated with a specific function (such as alignment, thermal conditioning, leveling, lens aberration control and the like).

A check decision 420 is made to decide whether a substrate is to be checked/inspected, based on the scanner data 400, and more specifically, on the categorical indicator assigned to that substrate. If it is decided not to check the substrate, then the substrate is forwarded for processing 430. It may be that a few of these substrates still undergo a metrology step 440 (e.g., input data for a control loop and/or to validate the decision made at step 420). If a check is decided at step 420, the substrate is measured 440, and based on the result of the measurement, a rework decision 450 is made, to decide whether the substrate is to be reworked. In another embodiment, the rework decision is made based directly on the categorical quality value determined by FDC system 410 without the check decision. Depending on the result of the rework decision, the substrate is either reworked 460, or deemed to be OK and forwarded for processing 430. If the latter, this would indicate that the categorical indicator assigned to that substrate was incorrect/inaccurate. Note that the actual decisions illustrated (check and/or rework) are only exemplary, and other decisions could be based on the categorical values/advice output from the FDC, and/or the FDC output could be used to trigger an alarm (e.g., to indicate poor scanner performance).

Figure 5:
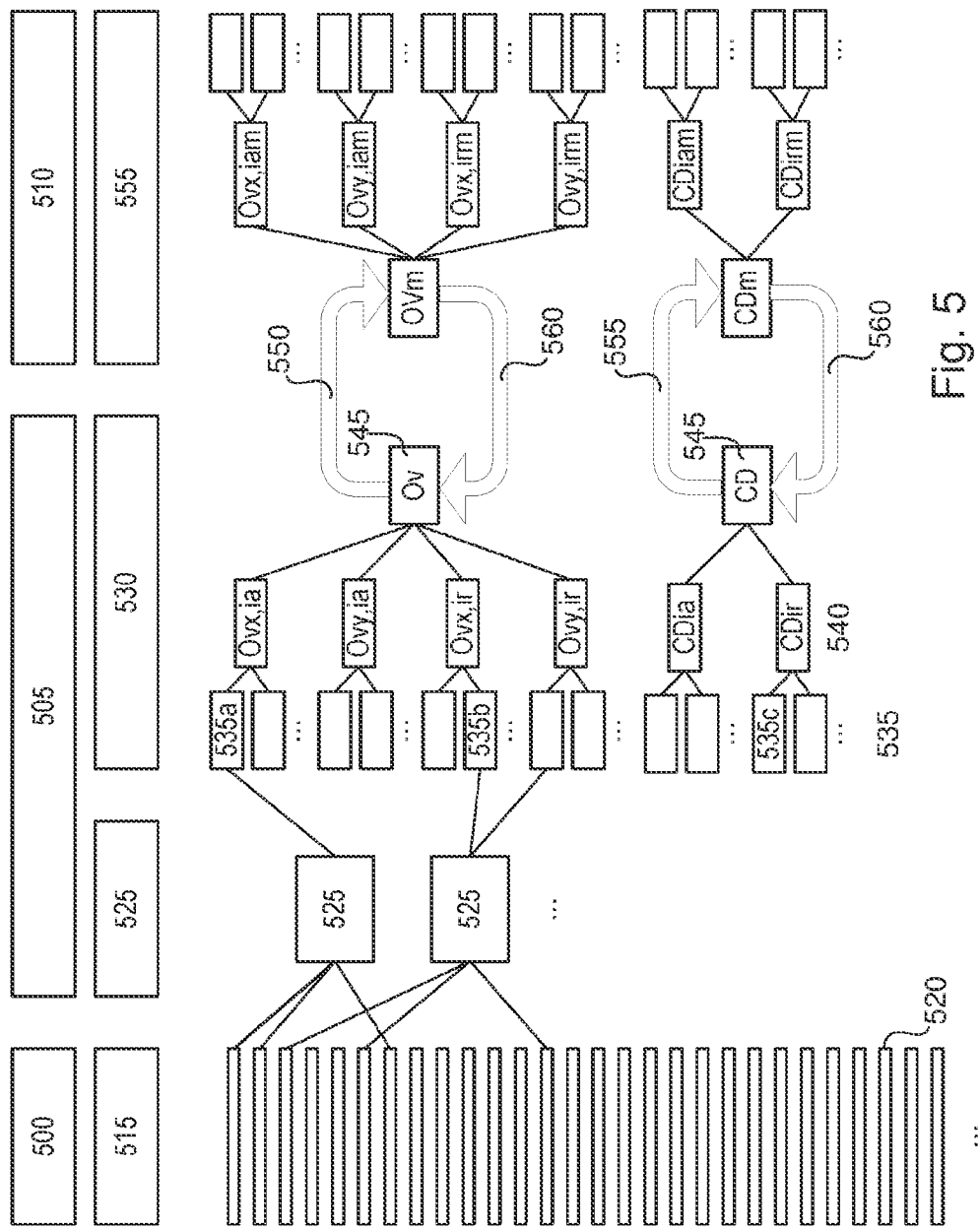
FIG. 5 is a flow diagram of the parameter and indicator hierarchy within a fault detection and classification of an embodiment of the present invention.

The result of the rework decision 450 for each substrate is fed back to the FDC system 410. The FDC system can use this data to refine and validate its categorization and decision advice (the categorical indicator assigned). In particular, it can validate the assigned categorical indicator against the actual decision and, based on this, make any appropriate changes to the categorization criteria. For example, it can alter/set any categorization thresholds based on the validation. As such, all the rework decisions made by the user at step 450 should be fed back so that all check decisions of the FDC system 410 are validated. In this way, the categorical classifier within the FDC system 410 system is constantly trained during production, such that it receives more data and therefore becomes more accurate over time FIG. 5 is flow diagram describing how the FDC system operates in greater detail. The flow diagram is split into three main stages, the scanner stage 500, the FDC system stage 505 and the verification stage 510. The scanner stage 500 yields numerical scanner or exposure data 515, which comprises the numerous data parameter or indicators 520 generated by the scanner during exposure. This scanner data may comprise, for example, any data generated by the scanner which may have an impact on the decision on which the FDC system will advise. For example, the scanner data may comprise measurement data from measurements routinely taken during (or in preparation for) an exposure, for example reticle and or wafer alignment data, leveling data, lens aberration data, any sensor output data etc. The scanner data may also comprise less routinely measured data (or estimated data), e.g., data from less routine maintenance steps, or extrapolated therefrom. A specific example such data may comprise source collector contamination data for EUV systems.

The FDC system stage 505 derives numerical functional indicators 525 based on the scanner data. These functional indicators 525 may be trained on production data so as to reflect actual usage of the scanner (e.g., temperature, exposure intervals etc.). The functional indicators 525 can be trained, for example, using statistical, linear/non-linear regression, deep learning or Bayesian learning techniques. Reliable and accurate functional indicators 525 may be constructed, for example, based on the scanner parameter data and the domain knowledge, where the domain knowledge may comprise a measure of deviation of the scanner parameters from nominal. Nominal may be based on known physics of the system/process and scanner behavior.

Models which link these indicators to on-product categorical indicators 530 can then be defined. The categorization can be binary (e.g., OK/NOK) or a more advanced classification based on measurement binning or patterns. The link models tie the physics driven functional indicators to observed on-product impact for specific user applications and way of working. The categorical indicators 530 aggregate the functional indicators 525 according to the physics of the system. In the specific example shown here, there are three levels or hierarchies of categorical indicators, a first level 535, second level 540 and third level 545. This is purely an example, and in other embodiments, the first level or second level could be used as the output advice in the decision making, and/or there could be any number of levels.

In the specific example shown here (purely for illustration), the first level comprises overlay contributors (for example, one overlay contributor 535a may be a reticle align contributor to X direction intra-field overlay Ovx,ia, another 535b may be a reticle align contributor to Y direction inter-field overlay OVy,ir, and yet another 535c a leveling contributor to inter-field CD, CDir). The second level categorical indicators 540 aggregates the first level categorical indicators 535 in terms of direction (X and Y) and inter-field ir versus intra-field ia for overlay Ov and in terms of inter-field ir versus intra-field ia for CD. The third level categorical indicators 545 comprise an Overlay indicator Ov (e.g., is overlay OK/NOK) and a CD indicator CD (e.g., is CD OK/NOK). The categorical indicators mentioned above are purely for example, and any suitable alternative indicators may be used, including user-customized health indicators. The only condition is that the indicator be categorizable, can be linked to the functional indicators of layer 525, and that sufficient data can be generated to train the model.

These indicators 545 can then be used to provide advice and/or make process decisions 550, such as whether to inspect and/or rework a substrate. For example, if overlay is deemed to be NOK, it may trigger a decision to inspect and rework the substrate to prevent yield loss. Another example, specific to EUV, is to train the model to determine when EUV source collector contamination results in an LCDU value which is not acceptable. Acceptability criteria shall be learned by the system.

The categorical indicators 530 may be derived from models/simulators based on machine learning techniques. Such a machine learning model can be trained with historical data (prior indicator data) labeled according to its appropriate category (i.e., should it be reworked). The labeling can be based on expert data (e.g., from user input) and/or (e.g., based on) measurement results, such that the model is taught to provide effective and reliable prediction of substrate quality based on future numerical data inputs from scanner data. The system categorical indicator training may use, for example, feedforward neural network, random forest, and/or deep learning techniques. Note that the FDC system does not need to know about any user sensitive data for this training; only a higher-level categorization, tolerance and/or decision (e.g., whether or not a substrate would be reworked) is required.

As such, an artificial intelligence model may be created which uses machine learning techniques (e.g. regression, convolutional neural networks, transfer learning and deep reinforcement learning) and model checking (e.g. SAT and SMT constraint solvers) to automatically adapt the indicator control limits/thresholds or predictions. The learning is validated and reinforced by building a feedback loop between the model which predicts certain values (e.g. OVL X is OK/NOK) and verification data which verifies whether the prediction was accurate (e.g., comprises the categorical values which the model/FDC system should have predicted). This may be achieved in a verification stage 510, in which inspection/metrology data 555 (numerical metrology data, suffixed m) is measured. The verification are the values that should have been predicted by the Model (e.g. OVL X is OK). By feeding that information back 560 to the model, the model can adapt to match the results observed by the customer, e.g., by changing a threshold value in one or more of its categorical models. The model is therefore versatile in the sense that a process-specific balancing between decision is transferred to the threshold utilized by the machine learning model to decide whether a wafer should be reworked or not.

Figure 6A:
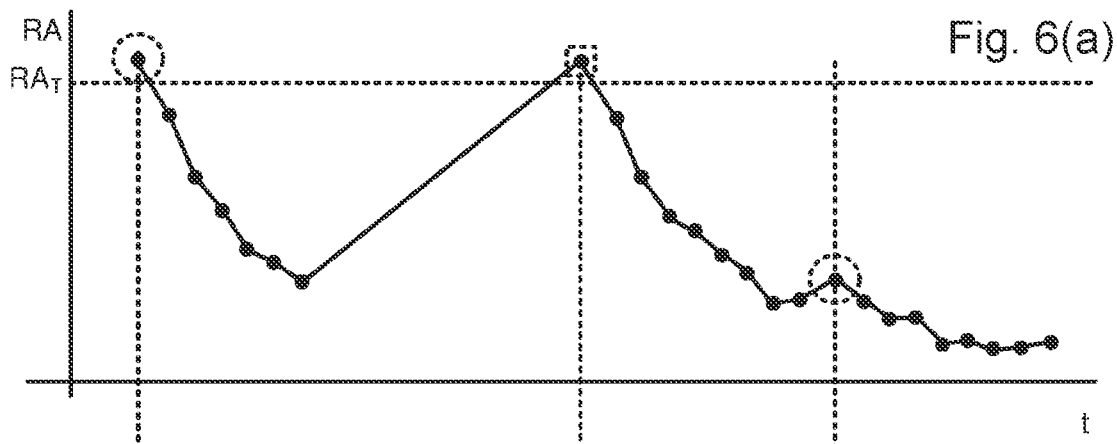
FIG. 6(a) is a plot of raw parameter data, more specifically reticle align (RA) data, against time t.
Figure 6B:
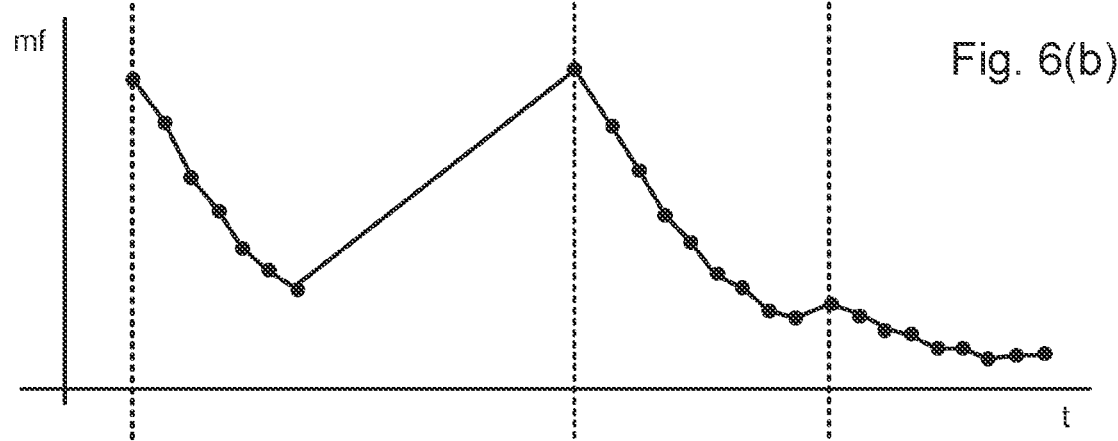
FIG. 6(b) is an equivalent non-linear model function mf derived according to a method of an embodiment of the invention.
Figure 6C:
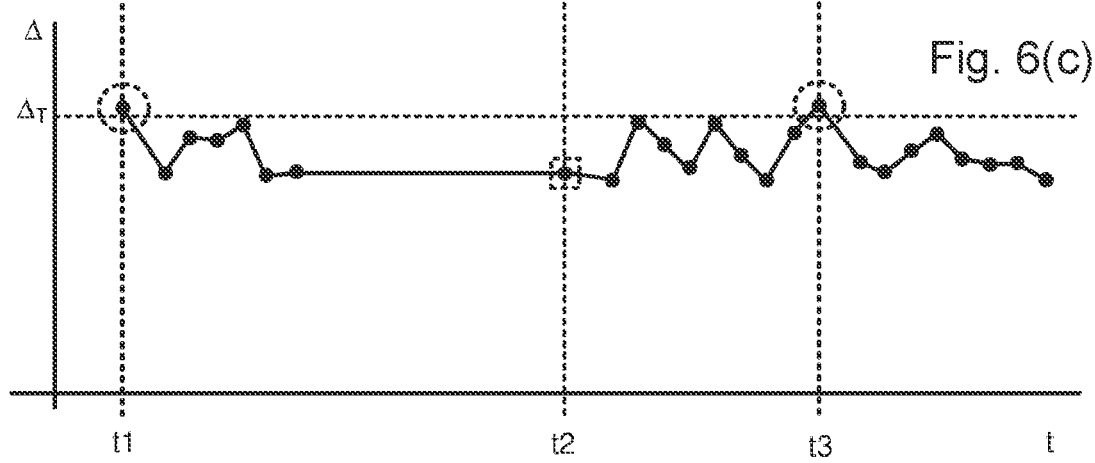
FIG. 6(c) comprises the residual Δ between the plots of FIG. 6(a) and FIG. 6(b), illustrating a categorical indicator according to a method of an embodiment of the invention.

FIG. 6 comprise three plots which illustrate the deriving of the functional and categorical indicators, and their effectiveness over the statistical indicators used presently. FIG. 6(*a*) is a plot of raw parameter data, more specifically reticle align (RA) against time t. FIG. 6(*b*) is an equivalent (e.g., for reticle align) non-linear model function (or fit) mf derived according to methods described herein. As described, such a model can be derived from knowledge of the scanner physics, and can further be trained on production data (e.g., reticle align measurements performed when performing a specific manufacturing process of interest). The training of this model may use statistical, regression, Bayesian learning or deep learning techniques, for example. FIG. 6(*c*) comprises the residual Δ between the plots of FIG. 6(*a*) and FIG. 6(*b*) which can be used as the functional indicator of the methods disclosed herein. One or more thresholds $\Delta_T$ can be set and/or learned (e.g., initially based on user knowledge/expert opinion and/or training as described), thereby providing a categorical indicator. In particular, the threshold(s) $\Delta_T$ is/are learned by categorical classifier block 530 during the training phase which trains the categorical classifier. It may be that these threshold values are actually unknown or hidden (e.g., when implemented by a neural network).

Values for the functional indicator or residual Δ can therefore be directly input to the categorical classifier which then predicts the appropriate category (e.g., OK or NOK). In this case all points below the threshold $\Delta_T$ are deemed OK, and the points (i.e., in this example at times t1 and t3) above the threshold $\Delta_T$ are deemed NOK.

It is instructive to compare this to the statistical control technique which is typically employed on the raw data at present. Setting a statistical threshold RAT to the raw data of FIG. 6(*a*) will result in the outlier at time t1 being identified, but not that at time t3. Furthermore, it will incorrectly identify the point at time t2 as an outlier, when in fact it is not (i.e., it is OK) according to the categorical indicator disclosed herein (illustrated in FIG. 6(*c*)).

As such, a decision making method/system is described herein, for which the number of false positives and negatives will decrease. The improved prediction functionality results from the use of new indicators derived from scanner physics, and that the criteria (thresholds) for setting a categorical indicator value are determined and learned from actual product use cases. Threshold/control limit maintenance is replaced by the automated (no human intervention required) validation feedback loop described, i.e., by monitoring indicator accuracy. Furthermore, the feedback loop can be as close as possible to the scanner to prevent noise introduced by other process steps. The decision model therefore comprises a single model which integrates physics models and machine learning models and automatically adapts its predictions from user application.

It should be appreciated that deviation from nominal is only one possible way to determine an indicator (e.g., OK/NOK). The concepts herein are more generally applicable. For example, they can be used to cluster Scanner behaviors (e.g., into different classes). Provided that a user can label the data with sufficiently high accuracy and has sufficient data for training, each user could have different labels for the same model.

In an optional embodiment (which may be used in combination with any of the other embodiments disclosed herein), the machine learned model or models described herein (e.g., any of the FDC systems), having been trained using supervised training techniques to aggregate and classify the functional indicators 525 to obtain categorical indicators, may be supplemented with an additional (e.g., semi-supervised) machine learned method.

Semi-supervised techniques may be applied in a number of different ways and on a number of different types of data. For example, such a method may apply unsupervised and/or semi-supervised techniques in parallel with supervised techniques to increase prediction accuracy and reduce sensitivity to label quantity and imbalance. Semi-supervised techniques may be applied on top of labels for a training set to identify non-detectable failure patterns (e.g. etch issues resulting in poor overlay but which cannot be observed inside scanner). Semi-supervised techniques may be applied on label values (when available) to check the quality of failure identification. Furthermore semi-supervised learning and feature impact analysis techniques may be applied on model predictions to provide relevant root cause indicators.

Such an embodiment may comprise defining of two decision boundaries: a first decision boundary using a supervised method which will learn to discriminate between two classes (e.g., as has already been described); and a second decision boundary using an unsupervised method (e.g., a clustering algorithm or similar) which can learn a "normal" region which has a high density of data points.

Figure 7:
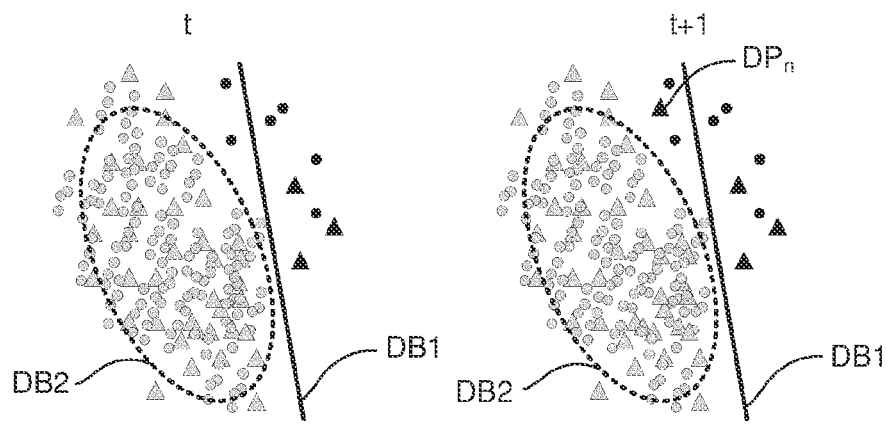
FIG. 7 shows a data population at two time instances conceptually illustrating an embodiment which uses two decision boundaries.

FIG. 7 conceptually illustrates such an approach. It shows a data set with each point representing a wafer in any (non-specific) data space at two time instances (time t and t+1). The gray data points are OK wafers and black data points are NOK wafers. In each case a triangle signifies a labeled wafer and a circle an unlabeled wafer. At time t, the first decision boundary DB1 is determined using supervised techniques (calibrated/learnt based on the labeled wafers). In parallel a second decision boundary DB2 is determined using unsupervised or semi-supervised techniques (e.g., which divides normal/nominal behavior from less normal/abnormal/outlier behavior). An advantage of having two decision boundaries, as illustrated by the equivalent plot for time t+1 is that it now becomes possible to capture new abnormal behavior; e.g., new NOK data point DPn which is on the OK side of first decision boundary DB1 but on the abnormal side of second decision boundary DB2. Such abnormal characteristics were not discovered during training, hence its incorrect classification with respect to the decision boundary DB1. It should be noted that there may be more than one first decision boundary (i.e., where the first decision model provides a non-binary categorical indicator output). Similarly, there may be more than one second decision boundary.

A metric to assess the model performance may be the ROC AUC (Area under the Receiver Operating Characteristics ROC Curve) as it represents the degree of separability between classes (considering various thresholds settings). Using the ROC curve enables the setting of a threshold which minimizes false negatives. This metric is especially useful when there is a class imbalanced classification task.

Figure 8:
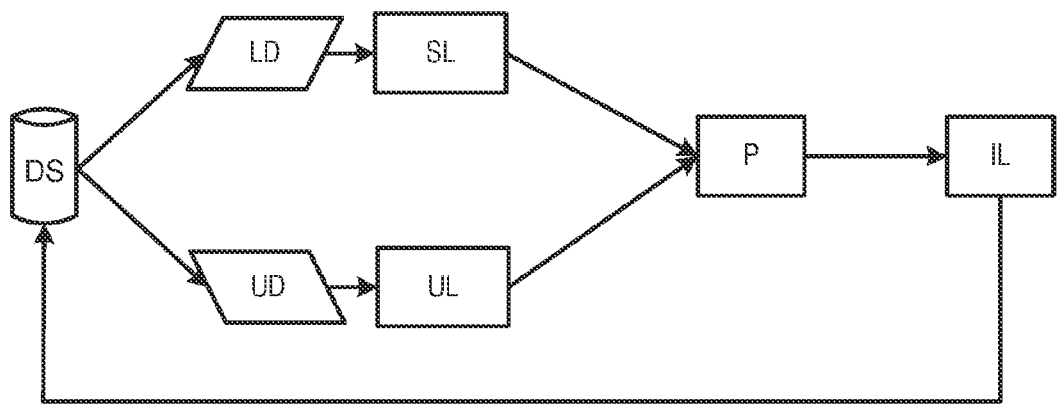
FIG. 8 is a flow diagram describing a method as conceptually illustrated in FIG. 7.

FIG. 8 is a flow diagram illustrating an exemplary method according to such an embodiment. A data set DS comprises labeled data LD (typically only a small proportion e.g., less than 10% of data set DS) and unlabeled data UD (e.g., typically over 90% of data set DS). The labeled data LD is used (as before) to train and/or verify a supervised learning method SL. The unlabeled data UD is used to train an unsupervised (or semi-supervised) learning method UL. The output of these two methods are combined in a prediction step P; e.g., by assigning a specific weight on the respective decisions output of the two methods SL, UL. The weighting may comprise or begin with a default (e.g., 50% each), and be subsequently optimized (e.g., to maximize model performance). This may comprise, for example, optimizing this weighting to increase/maximize ROC AUC. The optimization may additionally or alternatively comprise an optimization of hyperparameters for one or both learning methods SL, UL. The unified prediction P should perform better than any single individual decision output. At step IL, metrology and labeling may be performed for prediction evaluation and the results fed back to the data set DS. The supervised model SL may be fed back with data for all the inspected wafers (including both classes) while the unsupervised model UL may only receive the "normal" class.

Individual predictions P may be explained by displaying top features driving a wafer failure; and by recommending some actionable items derived from the new data knowledge discovered (during development) in combination with domain physics knowledge. Based on the prediction and the distribution of the features, it will be possible to identify and discriminate between scanner issues and process issues. The prediction performance should increase by segregating process issues out of the dataset.

Advantages of such a method include:

More stable and higher model accuracy with relevant prediction explanation.

Simpler and faster troubleshooting and better separation of scanner vs. process issues.

User label enhancement system to increase training set size and model prediction accuracy.

User label classification techniques to isolate scanner-detectable issues and identify potential issues in user labeling.

Generic failure prediction explanation engine built on top of scanner physical features.

New learning on Scanner behavior and elicitation of new control and feedback loops inside Scanner.

In another embodiment (which may be used in combination with any of the other embodiments disclosed herein), a transfer learning approach is proposed to reuse trained machine learned models (e.g., an FDC system as disclosed herein) from one layer/machine/FAB to another use case as much as possible. Presently, a machine learned model is customized per layer per machine. The feedback parameters differ per FAB.

In an embodiment, the machine learned model may comprise a trained neural network. As described in relation to FIG. 5, the input may comprise functional KPIs and the output may comprise categorical indicators. The first layer(s) of the neural network transform the functional KPIs to a common form so that they are comparable with each other. The next layer(s) relates the functional KPIs and creates the system KPI (overlay and focus maps etc.). The final layer(s) computes the categorical indicators; these are customized per layer and fab.

Reference fab and/or layer indicators may be defined for a last layer. For a new wafer layer/machine/FAB it is proposed to use transfer learning in order to reuse the information obtained from previously performed training. In practice this usually means that only the output layer of the neural network needs to be re-trained using the new data.

In the classic supervised learning scenario of machine learning, if a model is trained for some task and a domain A, it is assumed that the labeled training data provided for training the model relates to the same task and domain. A model A can then be trained on this dataset such that it will be expected to perform well on unseen data of the same task and domain A. On another occasion, when given data for some other task or domain B, labeled data for this task or domain B would normally be required to train a new model B.

The traditional supervised learning paradigm breaks down when there is insufficient labeled data for the task or domain in question for training a reliable model. If, for example a model for domain B (related to A) is to be trained, then application of model A (trained on domain A) will typically perform fairly poorly as the model has inherited the bias of its training data and does not know how to generalize to the new domain. If a model is to be trained to perform a new task, such as predicting multiple wafer states (e.g., OK/NOK/uncertain), it is not possible to simply reuse an existing model and expect good performance, as the labels between the tasks differ.

Transfer learning enables such scenarios to be better accommodated by leveraging the already existing labeled data of a related task. The knowledge gained in solving a source task in a source domain is applied to a problem of interest. In practice, it is sought to transfer as much knowledge as possible from the source setting to the target task or domain.

Figures 9A, 9B:
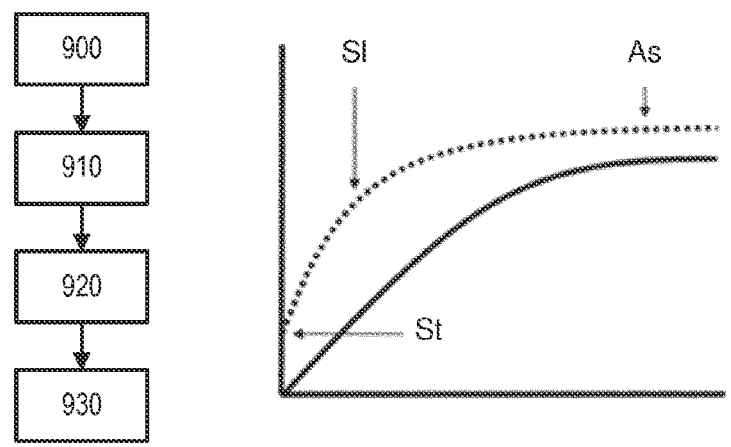
FIG. 9(a) shows a flow diagram describing a method of transfer learning usable in embodiments disclosed herein.
FIG. 9(b) shows a plot of performance against training for such an embodiment and an embodiment without transfer learning.

FIG. 9(a) is a flowchart describing an exemplary method for achieving this. At step 900 a source task (e.g. predict wafer OK/NOK for task/layer A) is selected. At step 910 a source model is developed (e.g., use available data to train the model). At step 920, this model is applied to a new task (e.g. predict wafer OK/NOK/uncertain for task/layer B). At step 930, the model is tuned (e.g. with all weights fixed in all layers of the neural network except for the final one or more layers) by training the model, more specifically the final one or more layers, on new data.

The benefits of transfer learning for scanner performance prediction are illustrated in the plot of performance against training shown in FIG. 9(b): The dotted line is a performance vs. training plot using transfer learning and the solid line is an equivalent plot without transfer learning. The advantages of transfer learning include:
  Higher start St. The initial performance (before refining the model) of the source model is higher than it otherwise would be.
  Steeper slope SI. The rate of improvement of performance during training of the source model is steeper than it otherwise would be.
  Higher asymptote As. The converged performance of the trained model is better than it otherwise would be.
  Less training data required. Since only a subset of degrees of freedom (weights) are optimized during transfer learning, generally less data is required than for a full network optimization.

A couple of specific machine learned FDC systems and methods will now be described, relating to particular input data sets and/or parameters (categorical indicators) of interest.

In one such specific application, an FDC system can be trained to provide a categorical indicator decision based on an in-line edge bead measurement following an edge bead removal step. The categorical indicator can indicate whether the edge bead position is indicative of expected water loss sufficient to result in defect. The categorical indicator may be binary; e.g., OK/NOK or non-binary.

After photoresist coating in the track, the edge may be rinsed by an organic solvent to remove excess material. This process is known as Edge Bead Removal (EBR). The settings (e.g. flow, solvent type, nozzle position) used in this step determine the edge or "EBR cut" of the resist. Typically the EBR position is measured offline using a specific tool (e.g., an ellipsometry tool). The EBR position has been observed to have a significant effect on the amount of water loss from the immersion hood (IH) of an immersion scanner when it passes the wafer edge. Water droplets left by the IH lead to watermarks (WMs), which impact yield. To prevent these WMs, users can apply slowdowns (slowing movement of the IH), which reduces the water loss but has a negative impact on productivity (wafers per hour).

It is proposed herein to use the scanner level sensor (e.g., a UV level sensor) to measure the edge bead position inline and use this to decide on an action for the lithographic process. It has been shown that level sensor data can be used to infer edge bead position and variation thereof.

A number of factors may play a role in the relationship between level sensor data (wafer reflection data) and edge bead position, including the optical properties of the resist, reflection from wafer (stack) below, resist thickness and level sensor spot size (in the latter case, a level sensor spot size in the region of 1 mm or lower may be preferred as EBR is typically in the range of 0 to 3 mm).

The action may comprise, for example, deciding whether or not to apply a slowdown (and/or strip and recoat the wafer). Where there are more than two categories for the categorical indicator, the method may decide on a degree of slowdown and/or decide between no slowdown, slowdown or (for extreme cases) strip and recoat.

Training of a model to infer edge bead position (e.g., whether OK and NOK) may use any of the methods already described, e.g., machine learning based on labeled training data.

In another specific implementation it is proposed to use wafer table temperature sensor signals as input to a suitable trained model for a categorical prediction (e.g., whether wafer is OK/NOK). Wafer rework can therefore be suggested based only on thermal measurements by the wafer table sensors, such thermal measurements being performed (e.g., on the measure-side of a two stage scanner), for all wafers and layers.

Such a proposal may comprise modeling of thermal wafer table measurements in such a way that it can predict and approximate an overlay metric such as Residual Overlay Performance Indicator (ROPI) when the latter is not available (e.g. for the zero layer) or during matching of different machines. Residual analysis or ROPI characterizes how well the modeled wafer grid fits into the measured positions. It has been shown that a cool down of more than approximately 1 mK sensed on the wafer periphery, is indicative of high (NOK) ROPI. However, if the center of wafer shows the same or similar cooling, then ROPI is likely to be normal (OK). Such an observation may be used as a basis for a model.

Based on the model output in this embodiment, one or more actions may be performed, which may include: better stabilization of the wafer table temperature at the periphery and/or a re-clamp the wafer when high ROPI is predicted (in the latter case the thermal induced deformation will be released and any water droplets which likely caused it will not be present after subsequent clamping).

Being able to predict the wafers with high ROPI can also be used to determine whether rework is necessary as there will probably be very high yield loss if such wafers go unnoticed in early layers. Since such events are relatively rare (e.g., 1 wafer out of 20) and rework is costly, the number of "good wafers" that are reworked should be low. Therefore, as in many of the above embodiments, since it is a rare event model with imbalanced risk on false positive and false negative predictions, a new metric is also proposed which takes those characteristics into account. Standard metrics such as accuracy and F1, do not properly account for rare events and risk. Such a new metric may be based on a weighted harmonic mean and may be used to compare different modeling techniques for modeling any of the decisions models disclosed herein.

The new metric may comprise a combination of a first function $F_{\beta,1}(s_1,s_2)$ where $s_1$ and $s_2$ are respectively miss rate (out of all predicted OK, how many were actually NOK) and false omission rate (out of all actually NOK, how many predicted OK) and a second function $F_{\beta,2}(s_1,s_2)$ where $s_1$ and $s_2$ are respectively false positive rate (out of all predicted NOK, how many actually OK) and false omission rate. In each case the functions may take the form:

$$F_\beta(s_1, s_2) = \frac{1}{\frac{1}{\beta+1}s_1 + \frac{\beta}{\beta+1}s_2}$$

where second statistic $s_2$ is considered $\beta$ times more important than the first statistic $s_1$. As such, first function $F_{\beta,1}$(miss rate, false omission rate) places a partial focus on false negatives (i.e. missed high ROPI wafers) and second function $F_{\beta,2}$(false positive rate, false omission rate) places a partial focus on false positives (i.e. normal ROPI wafers indicated as high ROPI). These functions can be combined on a single metric, the model metric MM:

$$MM = 1 - F(F_{\beta,1}, F_{\beta,2}) = 1 - \frac{1}{\frac{1}{2}F_{\beta,1} + \frac{1}{2}F_{\beta,2}}$$

The model metric MM will have a range between 0 and 1, a higher value being indicative of a better model. By determining this model metric for different candidate models, a preferred model may be chosen.

A current approach to train any of the machine learning (ML) models described herein may comprise using scanner signals generated during lot production and measurement results (e.g., categorical and/or raw measurement data). The machine learning model typically requires a lot of training data and needs substantial time to obtain a required accuracy. An estimation suggests this may take up to 4 weeks of production.

In addition, the training set will have significantly fewer failed (NOK) wafers compare to good (OK) wafers. This limits the type of machine learning techniques which can be applied. For example, known issues which may cause performance deterioration and which are presently not modelled (unless they occur by chance) due to lack of available data include inter alia: reticle contamination, bubble in immersion hood, wafer table or wafer contamination and/or wafer edge roll off.

To address this, a proposed embodiment comprises constructing a prior-knowledge model based on domain (scanner) knowledge. The existing scanner lot data and wafer measurement data may be modified, for example, by adding artificial fingerprints of already known scanner issues. Input data may comprise signals associated with or representative of particular scanner issues (e.g., including known but relatively rare issues) and output data may comprise an expected wafer quality indication (expected categorical indicator). For a large selection of scanner issues (e.g., including contamination/lens drifts etc.) input-output data can be derived (e.g., synthesized) and subsequently used to augment the existing training data set used to train the machine learning model for scanner performance detection. Additionally, in such a method, behavior which is known not to compromise wafer quality can be used to augment the data.

As such, a method for training a model used in predicting a quality of a substrate based on a state of a process is disclosed. The method comprises: generating, by a computer system, a plurality of states of the process; determining an expected quality of a substrate for each state of the process out of the plurality of states, based on a known relation between at least one parameter characterizing the state of the process and the quality of the substrate; and inputting the plurality of states and corresponding expected qualities to train the model. Such an embodiment may be used in combination with any of the other embodiments disclosed herein to train any of the models described herein.

The effect is that an initially modest training set becomes larger and more varied, and therefore can improve the scope of the machine learning model. This means that scanner performance detection can become more accurate, and more reliable scanner-to-scanner, without depending on vast amounts of production data.

Figure 10:
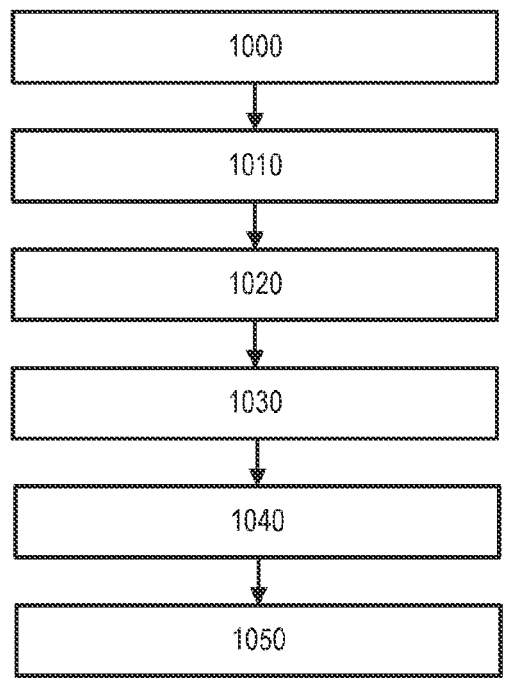
FIG. 10 is a flow diagram describing a method of generating synthetic training data and using this to train a model usable in embodiments disclosed herein.

FIG. 10 is a flowchart describing an exemplary method for such an embodiment. At step 1000 an incomplete prior-knowledge model is built which comprises input signals which may be typical for scanner issues and categorical indicators as output (e.g., wafer OK/NOK/unknown). The 'unknown' label is used to represent lacking information in the prior-knowledge model, and as such the model is incomplete. At step 1010, based on domain knowledge, input signals for the model of step 1000 are created. At step 1020, an output of the model from step 1000 is computed corresponding to the input signals of step 1010 (e.g., estimating the expected output OK/NOK/unknown from the model which would be expected based on the input signals of step 1010). At step 1030, all data from step 1020 which generates 'unknown' output is discarded. At step 1040, the remaining data (e.g., data accorded, with a reasonable degree of certainty, an OK/NOK or other known categorical output) is used to augment the existing data. At step 1050, the machine learning model (e.g., any of the models described herein, including any of the FDC systems) is trained with the augmented dataset.

The following list is a non-exhaustive list of scanner issue examples which may be included in such a data augmentation. It may be that such issues are relatively rare and therefore often not included in conventionally generated training data. Such scanner issues may include, for example:
Wafer contamination;
Reticle contamination;
Wafer table contamination;
Wafer edge roll off;
Lens drifts;
Air bubble in immersion hood;
Timing hiccups.

Other examples may include examples of scanner behavior which intuitively may be expected to generate bad wafers, but actually do not. For example, errors which cancel themselves out.

An additional way of augmenting the data set is by adding artificial noise (e.g., of a known level and noise model) to the lot data and modeling the effect of this noise on the wafer measurement data. For example random noise may be added to overlay or focus scatterometry measurements as might be seen on a typical scatterometer (e.g., of a specific type). For a level sensor or an alignment sensor, a noise level which is typical for that sensor can be added.

By augmenting the original data set with synthetically generated input/output pairs the machine learning model is reinforced with prior knowledge.

Figure 11:
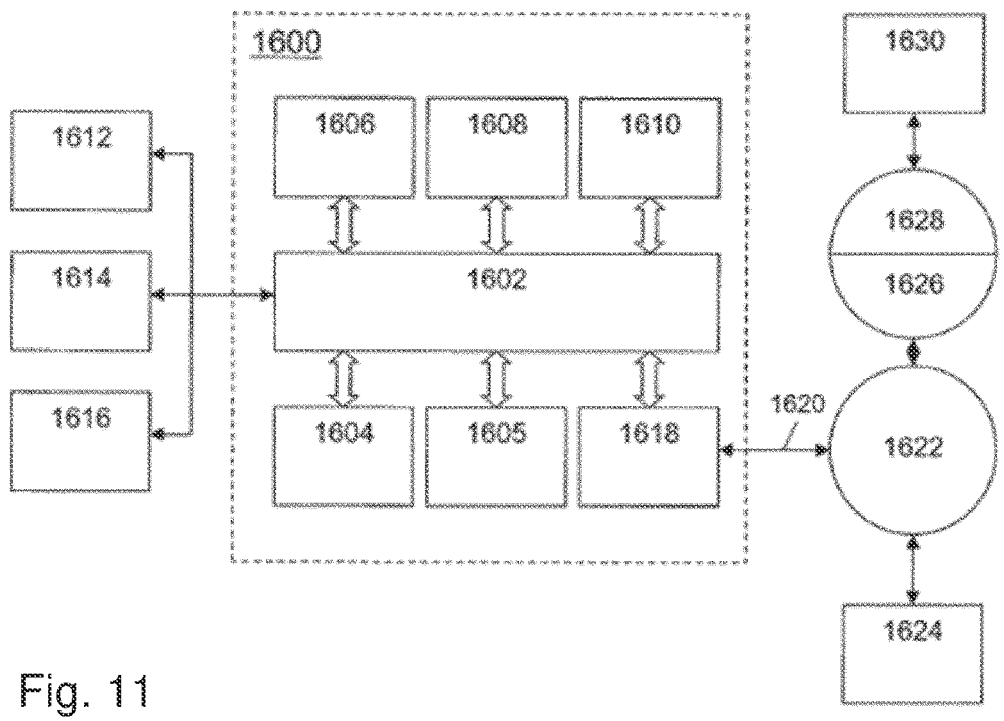
FIG. 11 is a block diagram illustrating a computer system which may assist in implementing methods according to embodiments of the invention.

FIG. 11 is a block diagram that illustrates a computer system 1600 that may assist in implementing the methods and flows disclosed herein. Computer system 1600 includes a bus 1602 or other communication mechanism for communicating information, and a processor 1604 (or multiple processors 1604 and 1605) coupled with bus 1602 for processing information. Computer system 1600 also includes a main memory 1606, such as a random access memory (RAM) or other dynamic storage device, coupled to bus 1602 for storing information and instructions to be executed by processor 1604. Main memory 1606 also may be used for storing temporary variables or other intermediate information during execution of instructions to be executed by processor 1604. Computer system 1600 further includes a read only memory (ROM) 1608 or other static storage device coupled to bus 1602 for storing static information and instructions for processor 1604. A storage device 1610, such as a magnetic disk or optical disk, is provided and coupled to bus 1602 for storing information and instructions.

Computer system 1600 may be coupled via bus 1602 to a display 1612, such as a cathode ray tube (CRT) or flat panel or touch panel display for displaying information to a computer user. An input device 1614, including alphanumeric and other keys, is coupled to bus 1602 for communicating information and command selections to processor 1604. Another type of user input device is cursor control 1616, such as a mouse, a trackball, or cursor direction keys for communicating direction information and command selections to processor 1604 and for controlling cursor movement on display 1612. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 1600 in response to processor 1604 executing one or more sequences of one or more instructions contained in main memory 1606. Such instructions may be read into main memory 1606 from another computer-readable medium, such as storage device 1610. Execution of the sequences of instructions contained in main memory 1606 causes processor 1604 to perform the process steps described herein. One or more processors in a multi-processing arrangement may also be employed to execute the sequences of instructions contained in main memory 1606. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1604 for execution. Such a medium may take many forms, including but not limited to, non-volatile media, volatile media, and transmission media. Non-volatile media include, for example, optical or magnetic disks, such as storage device 1610. Volatile media include dynamic memory, such as main memory 1606. Transmission media include coaxial cables, copper wire and fiber optics, including the wires that comprise bus 1602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1604 for execution. For example, the instructions may initially be borne on a magnetic disk of a remote computer. The remote computer can load the instructions into its dynamic memory and send the instructions over a telephone line using a modem. A modem local to computer system 1600 can receive the data on the telephone line and use an infrared transmitter to convert the data to an infrared signal. An infrared detector coupled to bus 1602 can receive the data carried in the infrared signal and place the data on bus 1602. Bus 1602 carries the data to main memory 1606, from which processor 1604 retrieves and executes the instructions. The instructions received by main memory 1606 may optionally be stored on storage device 1610 either before or after execution by processor 1604.

Computer system 1600 also preferably includes a communication interface 1618 coupled to bus 1602. Communication interface 1618 provides a two-way data communication coupling to a network link 1620 that is connected to a local network 1622. For example, communication interface 1618 may be an integrated services digital network (ISDN) card or a modem to provide a data communication connection to a corresponding type of telephone line. As another example, communication interface 1618 may be a local area network (LAN) card to provide a data communication connection to a compatible LAN. Wireless links may also be implemented. In any such implementation, communication interface 1618 sends and receives electrical, electromagnetic or optical signals that carry digital data streams representing various types of information.

Network link 1620 typically provides data communication through one or more networks to other data devices. For example, network link 1620 may provide a connection through local network 1622 to a host computer 1624 or to data equipment operated by an Internet Service Provider (ISP) 1626. ISP 1626 in turn provides data communication services through the worldwide packet data communication network, now commonly referred to as the "Internet" 1628. Local network 1622 and Internet 1628 both use electrical, electromagnetic or optical signals that carry digital data streams. The signals through the various networks and the signals on network link 1620 and through communication interface 1618, which carry the digital data to and from computer system 1600, are exemplary forms of carrier waves transporting the information.

Computer system 1600 may send messages and receive data, including program code, through the network(s), network link 1620, and communication interface 1618. In the Internet example, a server 1630 might transmit a requested code for an application program through Internet 1628, ISP 1626, local network 1622 and communication interface 1618. One such downloaded application may provide for one or more of the techniques described herein, for example. The received code may be executed by processor 1604 as it is received, and/or stored in storage device 1610, or other non-volatile storage for later execution. In this manner, computer system 1600 may obtain application code in the form of a carrier wave.

Further embodiments of the invention are disclosed in the list of numbered clauses below:

1. A method for making a decision within a manufacturing process, the method comprising:
    obtaining scanner data relating to one or more parameters of a lithographic exposure step of the manufacturing process;

applying a decision model which outputs a value for each of one or more categorical indicators based on the scanner data, each of the one or more categorical indicators being indicative of a quality of the manufacturing process; and deciding on an action based on a value of the categorical indicator.

2. A method according to clause 1, wherein the scanner data is generated by a lithographic apparatus during the lithographic exposure step.

3. A method according to clause 1, wherein the scanner data is measured during a maintenance action.

4. A method according to any preceding clause, wherein each of the one or more categorical indicators is derived from one or more functional indicators.

5. A method according to clause 4, wherein each of the one or more functional indicators are determined from one or more functional models based on known physics related to the lithographic exposure step and/or an associated apparatus.

6. A method according to clause 4 or 5, wherein the one or more functional indicators comprise at least one functional indicator which describes a deviation of a parameter value from nominal behavior, the nominal behavior being derived from the known physics and/or redundancy.

7. A method according to clause 4, 5 or 6, wherein each of the one or more functional indicators is trained using one or more of: statistical technique, optimization, regression, or a machine learning technique.

8. A method according to any of clauses 4 to 7, wherein each of the one or more categorical indicators is derived from the one or more functional indicators by categorizing the functional indictors according to one or more applied and/or learned threshold values to the one or more functional indicators.

9. A method according to clause 8, comprising training the decision model on measurements performed on substrates having undergone the lithographic exposure step and corresponding decisions and/or categories assigned thereto, the training setting each of the one or more threshold values.

10. A method according to clause 9, wherein the training the decision model uses a machine learning technique comprises one or more of: a neural network technique, random forest technique and a deep learning technique.

11. A method according to any of clauses 8 to 10, comprising measuring substrates subsequent to the value for the categorical indicator output by the decision model, and validating the decision model output based on the measurements.

12. A method according to clause 11, wherein the validation step comprises altering one or more of the threshold values to improve prediction performance of the decision model.

13. A method according to any of clauses 4 to 12, wherein the one or more categorical indicators are each derived from an aggregation of multiple functional indicators.

14. A method according to clause 13, wherein the aggregation comprises aggregating multiple intermediate categorical indicators derived from the multiple functional indicators.

15. A method according to any preceding clause, wherein each of the one or more categorical indicators comprises a binary categorical indicator describing whether the parameter is within specification or otherwise.

16. A method according to any preceding clause, wherein each of the one or more categorical indicators relates to one or more of overlay, focus, critical dimension, critical dimension uniformity.

17. A method according to any preceding clause, wherein the scanner data comprises thermal data from temperature sensors on a wafer table of the scanner and the categorical indicator relates to overlay of a substrate manufactured according to the manufacturing process, the decision model relating the thermal data to an expected overlay metric.

18. A method according to any preceding clause, wherein the decision comprises deciding whether the substrate should be inspected as a possible candidate for rework.

19. A method according to any preceding clause, wherein the scanner data comprises level sensor data and the categorical indicator relates to edge bead position of an edge bead on a substrate being manufactured according to the manufacturing process, the decision model relating the level sensor data to an expected edge bead metric and/or defects due to water loss in the manufacturing process.

20. A method according to clause 19, wherein the action comprises slowing down the lithographic process based on the value for the categorical indicator.

21. A method according to any preceding clause, wherein the decision model is a first decision model defining one or more first decision boundaries; and the method further comprises applying a second decision model defining one or more second decision boundaries.

22. A method according to clause 21, wherein the first decision model is a supervised machine learning model and the second decision model is an unsupervised or semi-supervised machine learning model.

23. A method according to clause 21 or 22, wherein the second decision model is indicative of whether a data point is normal or abnormal, as delineated by the second decision boundary.

24. A method according to clause 21, 22 or 23, wherein a first output of the first decision model and a second output of the second decision model are combined according to a weighting to provide a combined output.

25. A method according to clause 24, comprising optimizing the weighting of the first output and second output and/or of one or more hyperparameters comprised within either or both of the first decision model and the second decision model.

26. A method according to clause 25, wherein the optimization maximizes the area under a receiver operator characteristics curve.

27. A method for constructing a decision model for making a decision within a manufacturing process, the method comprising:

obtaining scanner data relating to one or more parameters of a lithographic exposure step of the manufacturing process;

deriving one or more categorical indicators from the scanner data, each of the one or more categorical indicators being indicative of a quality of the manufacturing process based on at least one threshold value; and training the decision model on measurements performed on substrates having undergone the lithographic exposure step and corresponding decisions and/or categories assigned thereto, the training setting a value for each of the one or more threshold values, such that the decision model outputs an appropriate value for each of the one or more categorical indicators based on the scanner data.

28. A method according to clause 27, wherein the training the decision model is also based on expert knowledge.

29. A method according to clause 27 or 28, wherein the training of the model uses a machine learning technique comprising one or more of a neural network technique, random forest technique or a deep learning technique.

30. A method according to clause 27, 28 or 29 wherein each of the one or more categorical indicators is derived from one or more functional indicators.

31. A method according to clause 30, wherein each of the one or more functional indicators are determined from one or more functional models based on known physics related to the lithographic exposure step and/or an associated apparatus.

32. A method according to clause 30 or 31, wherein the one or more functional indicators comprise at least one functional indicator which describes a deviation of a parameter value from nominal behavior, the nominal behavior being derived from the known physics and/or redundancy.

33. A method according to clause 30, 31 or 32, wherein each of the one or more functional indicators is trained using one or more of: statistical technique, optimization, regression, or a machine learning technique.

34. A method according to any of clauses 30 to 33 wherein each of the one or more categorical indicators is derived from the one or more functional indicators by the application of the one or more threshold values to the one or more functional indicators.

35. A method according to any of clauses 30 to 34, wherein the one or more categorical indicators are each derived from an aggregation of multiple functional indicators.

36. A method according to clause 35, wherein the aggregation comprises aggregating multiple intermediate categorical indicators derived from the multiple functional indicators.

37. A method according to any of clauses 27 to 36, wherein each of the one or more categorical indicators comprises a binary categorical indicator describing whether the parameter is within specification or otherwise.

38. A method according to any of clauses 27 to 37, wherein each of the one or more categorical indicators relates to one or more of overlay, focus, critical dimension, critical dimension uniformity.

39. A method according to any of clauses 27 to 38, wherein the scanner data comprises thermal data from temperature sensors on a wafer table of the scanner and the categorical indicator relates to overlay of a substrate manufactured according to the manufacturing process, and the training of the decision model comprises relating the thermal data to an expected overlay metric.

40. A method according to any of clauses 27 to 39, wherein the scanner data comprises level sensor data and the categorical indicator relates to edge bead position of an edge bead on a substrate being manufactured according to the manufacturing process, and the training of the decision model comprises relating the level sensor data to an expected edge bead metric and/or defects due to water loss in the manufacturing process.

41. A method according to any of clauses 27 to 40, wherein the decision model is a first decision model defining one or more first decision boundaries; and the method further comprises training a second decision model defining one or more second decision boundaries, the first decision model being a supervised machine learning model and the second decision model being an unsupervised or semi-supervised machine learning model.

42. A method according to clause 41, wherein a first output of the first decision model and a second output of the second decision model are combined according to a weighting to provide a combined output; and the method comprises optimizing the weighting of the first output and second output and/or of one or more hyperparameters comprised within either or both of the first decision model and the second decision model.

43. A method according to clause 42, wherein the optimization maximizes the area under a receiver operator characteristics curve.

44. A method according to any of clauses 27 to 43, comprising obtaining a decision model having been trained on related data from a different domain and/or for a different task; wherein the training step comprising only training one or more output layers of the decision model for a present domain and/or task.

45. A method according to any of clauses 27 to 44, comprising generating synthetic training data and augmenting the data used in the training step with the training data.

46. A method according to clause 45, comprising:
generating a plurality of states of the process;
determining an expected quality of a substrate for each state of the manufacturing process out of the plurality of states, based on a known relation between at least one parameter characterizing the state of the process and the quality of the substrate; and
using the plurality of states and corresponding expected qualities as the synthetic training data.

47. A method according to clause 46, wherein the step of using the plurality of states and corresponding expected qualities as the synthetic training data comprises discarding any such data for which the expected qualities cannot be estimated with sufficient confidence.

48. A method according to any of clauses 45 to 47, comprising adding artificial noise to augment the synthetic training data.

49. A method according to any of clauses 27 to 48, comprising determining a model metric for a plurality of the decision models, each model metric comprising a combination of a first function and second function for the model, the first function comprising a weighted harmonic mean of a miss rate and a false omission rate and the second function comprising a weighted harmonic mean of a false positive rate and a false omission rate; and deciding on a decision model based on the model metrics.

50. A computer program comprising program instructions operable to perform the method of any of clauses 1 to 49, when run on a suitable apparatus.

51. A non-transient computer program carrier comprising the computer program of clause 50.

52. A processing system comprising a processor and a storage device comprising the computer program of clause 50.

53. A lithographic apparatus comprising the processing system of clause 50.

54. A method for categorizing a substrate subject to a semiconductor manufacturing process comprising multiple operations, the method comprising:
obtaining values of functional indicators derived from data generated during one or more of the multiple operations on the substrate, the functional indicators characterizing at least one operation;
applying a decision model comprising one or more threshold values to the values of the functional indicators to obtain one or more categorical indicators; and assigning a category to the substrate based on the one or more categorical indicators.

55. The method of clause 54, further comprising using the category assigned to the substrate to assign a decision to the substrate, the decision being one of: i) rework the substrate, ii) inspect the substrate, or iii) use the substrate in a subsequent process step.

56. A method according to clause 54, wherein the data is generated by a lithographic apparatus used in a lithographic exposure step of the semiconductor manufacturing process and the at least one operation is on ore more of: leveling the substrate, aligning the substrate, conditioning the substrate, exposing the substrate, measuring aberrations of a projection lens used in exposing the substrate.

57. A method according to clause 56, wherein at least one functional indicator is determined from one or more functional models based on known physics related to the lithographic exposure step and/or lithographic apparatus.

58. A method according to clause 57, wherein the one or more functional indicators comprise at least one functional indicator which describes a deviation of a parameter value from nominal behavior, the nominal behavior being derived from the known physics.

59. A method according to clause 55, wherein the decision model is trained on measurements performed on processed substrates having corresponding decisions and/or categories assigned thereto, the training setting at least one of the one or more threshold values.

60. A method according to clause 55, comprising training the decision model on measurements performed on processed substrates having corresponding decisions and/or categories assigned thereto, the training setting each of the one or more threshold values.

61. A method according to clause 60, wherein training the decision model uses a machine learning technique comprises one or more of: a neural network technique, random forest technique and a deep learning technique.

62. A method according to clause 54, comprising obtaining a measurement of the substrate subsequent to the categorical indicator output by the decision model, and validating the decision model based on the measurement.

63. A method according to clause 62, wherein the validation step comprises altering one or more of the threshold values to improve prediction performance of the decision model.

64. A method according to clause 54, wherein the one or more categorical indicators are each based on aggregation of multiple functional indicators.

65. A method according to clause 64, wherein the aggregation further comprises aggregating multiple intermediate categorical indicators derived from the multiple functional indicators.

66. A method according to clause 54, wherein each of the one or more categorical indicators relates to one or more of overlay, focus, critical dimension, critical dimension uniformity.

67. A method according to clause 56, wherein the data is associated with thermal data from temperature sensors on a wafer table of the lithographic apparatus and the categorical indicator relates to overlay of a substrate manufactured according to the manufacturing process, the decision model relating the thermal data to an expected overlay metric.

68. A method according to clause 56, wherein the data comprises level sensor data and the categorical indicator relates to edge bead position of an edge bead on a substrate being manufactured according to the manufacturing process, the decision model relating the level sensor data to an expected edge bead metric and/or defects due to water loss in the manufacturing process.

69. A method according to clause 54, wherein the decision model is a first decision model defining one or more first decision boundaries; and the method further comprises training a second decision model defining one or more second decision boundaries, the first decision model being a supervised machine learning model and the second decision model being a unsupervised or semi-supervised machine learning model.

70. A method according to clause 60, further comprising obtaining an initial decision model having been trained on related data from a different domain and/or for a different task; wherein the training step comprising only training one or more output layers of the initial decision model for a present domain and/or task.

71. A method for constructing a decision model for making a decision within a semiconductor manufacturing process, the method comprising:

obtaining data relating to one or more parameters of a patterning step of the semiconductor manufacturing process;

deriving one or more categorical indicators from the data, each of the one or more categorical indicators being indicative of a quality of the semiconductor manufacturing process based on at least one threshold value; and training the decision model on measurements performed on substrates having undergone the patterning step and corresponding decisions and/or categories assigned thereto, the training setting a value for each of the one or more threshold values, such that the decision model outputs an appropriate value for each of the one or more categorical indicators based on the data.

72. A computer program comprising program instructions operable to perform the method of clause 54, when run on a suitable apparatus.

73. A non-transient computer program carrier comprising the computer program of clause 72.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for categorizing a substrate subject to a semiconductor manufacturing process comprising multiple operations, the method comprising:
obtaining values of functional indicators derived from data generated during one or more operations of the multiple operations on the substrate, the functional indicators characterizing at least one operation;
applying a model comprising one or more threshold values for the values of the functional indicators to obtain one or more categorical indicators, wherein the model comprises a machine learning model trained using training data comprising: a) measurement results associated with processed substrates, and b) corresponding categories assigned to the processed substrates, the training of the machine learning model setting the one or more threshold values; and
assigning a category to the substrate based on the one or more obtained categorical indicators.

2. The method according to claim 1, wherein the data generated during the one or more operations is generated by a lithographic apparatus used in a lithographic exposure step of the semiconductor manufacturing process and the at least one operation is one or more selected from: leveling the substrate, aligning the substrate, conditioning the substrate, exposing the substrate, and/or measuring an aberration of a projection system used in exposing the substrate.

3. The method according to claim 2, wherein at least one functional indicator is determined from one or more functional models based on known physics related to the lithographic exposure step and/or lithographic apparatus.

4. The method according to claim 1, further comprising obtaining a measurement of the substrate subsequent to the categorical indicator output by the model, and validating the model based on the measurement.

5. The method according to claim 4, wherein the validating comprises altering one or more of the one or more threshold values to improve prediction performance of the model.

6. The method according to claim 1, wherein the model comprises a first decision model defining one or more first decision boundaries; and further comprising applying a second decision model defining one or more second decision boundaries.

7. The method according to claim 6, wherein the first decision model is a supervised machine learning model and the second decision model is an unsupervised or semi-supervised machine learning model.

8. The method according to claim 6, wherein a first output of the first decision model and a second output of the second decision model are combined according to a weighting to provide a combined output.

9. The method according to claim 8, further comprising optimizing the weighting of the first output and second output and/or optimizing one or more hyperparameters comprised within either or both of the first decision model and the second decision model.

10. The method according to claim 1, wherein each of the one or more categorical indicators relates to one or more selected from: overlay, focus, critical dimension, and/or critical dimension uniformity.

11. A computer program product comprising a non-transitory computer-readable medium comprising instructions therein that, when executed by a hardware processing system, are configured to cause the hardware processing system to at least:
obtain values of functional indicators derived from data generated during one or more operations of multiple operations of a semiconductor manufacturing process on a substrate, the functional indicators characterizing at least one operation;
apply a model comprising one or more threshold values for the values of the functional indicators to obtain one or more categorical indicators, wherein the model comprises a machine learning model trained using training data comprising: a) measurement results associated with processed substrates, and b) corresponding categories assigned to the processed substrates, the training of the machine learning model setting the one or more threshold values; and
assign a category to the substrate based on the one or more obtained categorical indicators.

12. The computer program product according to claim 11, wherein the data generated during the one or more operations is generated by a lithographic apparatus used in a lithographic exposure step of the semiconductor manufacturing process and the at least one operation is one or more selected from: leveling the substrate, aligning the substrate, conditioning the substrate, exposing the substrate, and/or measuring an aberration of a projection system used in exposing the substrate.

13. The computer program product according to claim 12, wherein at least one functional indicator is determined from one or more functional models based on known physics related to the lithographic exposure step and/or lithographic apparatus.

14. The computer program product according to claim 11, wherein the instructions are further configured to cause the hardware processing system to obtain a measurement of the substrate subsequent to the categorical indicator output by the model, and validate the model based on the measurement.

15. The computer program product according to claim 14, wherein the instructions are further configured to cause the hardware processing system to alter one or more of the one or more threshold values to improve prediction performance of the model.

16. The computer program product according to claim 11, wherein the model comprises a first decision model defining one or more first decision boundaries and wherein the instructions are further configured to cause the hardware processing system to apply a second decision model defining one or more second decision boundaries.

17. The computer program product according to claim 16, wherein the first decision model is a supervised machine learning model and the second decision model is an unsupervised or semi-supervised machine learning model.

18. The computer program product according to claim 16, wherein a first output of the first decision model and a second output of the second decision model are combined according to a weighting to provide a combined output.

19. The computer program product according to claim 18, wherein the instructions are further configured to cause the hardware processing system to optimize the weighting of the first output and second output and/or optimize one or more hyperparameters comprised within either or both of the first decision model and the second decision model.

20. The computer program product according to claim 11, wherein each of the one or more categorical indicators relates to one or more selected from: overlay, focus, critical dimension, and/or critical dimension uniformity.

* * * * *